(12) United States Patent
Robin et al.

(10) Patent No.: US 10,944,025 B2
(45) Date of Patent: Mar. 9, 2021

(54) LIGHT-EMITTING DIODE WITH MULTIPLE QUANTUM WELLS AND ASYMMETRIC P-N JUNCTION

(71) Applicant: COMMISSARIAT À L'ÉNERGIE ATOMIQUE ET AUX ÉNERGIES ALTERNATIVES, Paris (FR)

(72) Inventors: Ivan-Christophe Robin, Grenoble (FR); Hubert Bono, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/779,516

(22) PCT Filed: Mar. 25, 2014

(86) PCT No.: PCT/EP2014/055964
§ 371 (c)(1),
(2) Date: Sep. 23, 2015

(87) PCT Pub. No.: WO2014/154690
PCT Pub. Date: Oct. 2, 2014

(65) Prior Publication Data
US 2016/0049544 A1 Feb. 18, 2016

(30) Foreign Application Priority Data

Mar. 28, 2013 (FR) .................... 13 52839

(51) Int. Cl.
*H01L 29/06* (2006.01)
*H01L 33/06* (2010.01)
(Continued)

(52) U.S. Cl.
CPC .......... *H01L 33/06* (2013.01); *H01L 33/0025* (2013.01); *H01L 33/12* (2013.01);
(Continued)

(58) Field of Classification Search
CPC ..... H01L 33/0025; H01L 33/06; H01L 33/12; H01L 33/24; H01L 33/32
(Continued)

(56) References Cited

U.S. PATENT DOCUMENTS

| | | | | |
|---|---|---|---|---|
| 4,839,899 A | * | 6/1989 | Burnham | B82Y 20/00 372/20 |
| 5,021,360 A | * | 6/1991 | Melman | B82Y 20/00 117/105 |

(Continued)

FOREIGN PATENT DOCUMENTS

| | | |
|---|---|---|
| EP | 1 914 813 A2 | 4/2008 |
| EP | 2 610 927 A2 | 7/2013 |
| WO | 2013/114152 A1 | 8/2013 |

OTHER PUBLICATIONS

Ni et al., "InGaN staircase electron injector for reduction of electron overflow in InGaN light emitting diodes", Applied Physics Letters 97 (2010).*

(Continued)

*Primary Examiner* — Jay C Kim
(74) *Attorney, Agent, or Firm* — Oblon, McClelland, Maier & Neustadt, L.L.P.

(57) ABSTRACT

A light-emitting diode including: a first n-doped semiconductor layer configured to form a cathode, and a second p-doped semiconductor layer configured to form an anode, and together forming a p-n junction of the diode; an active zone located between the first layer and the second layer, including at least two emissive layers including a semiconductor capable of forming quantum wells, and a plurality of semiconductor barrier layers such that each emissive layer is located between two barrier layers; an n-doped semiconductor buffer layer located between the first layer and the active zone, the n-dope semiconductor of the buffer layer having a band gap energy less than or equal to about 97% of the band (Continued)

gap energy of the p-doped semiconductor of the second layer.

15 Claims, 8 Drawing Sheets

(51) Int. Cl.

| | |
|---|---|
| *H01L 33/14* | (2010.01) |
| *H01L 33/00* | (2010.01) |
| *H01L 33/12* | (2010.01) |
| *H01L 33/24* | (2010.01) |
| *H01L 33/32* | (2010.01) |

(52) U.S. Cl.
CPC .............. *H01L 33/14* (2013.01); *H01L 33/24* (2013.01); *H01L 33/32* (2013.01)

(58) Field of Classification Search
USPC ........................................................ 257/13
See application file for complete search history.

(56) References Cited

U.S. PATENT DOCUMENTS

| | | | | |
|---|---|---|---|---|
| 5,670,798 A * | 9/1997 | Schetzina | ............. | H01L 29/205 257/101 |
| 5,684,309 A * | 11/1997 | McIntosh | ............... | B82Y 20/00 257/101 |
| 6,194,241 B1 | 2/2001 | Tsutsui | ................ | H01L 21/0242 257/E21.113 |
| 6,504,171 B1 * | 1/2003 | Grillot | ................... | B82Y 20/00 257/13 |
| 6,657,234 B1 * | 12/2003 | Tanizawa | ................ | B82Y 20/00 257/103 |
| 6,734,467 B2 * | 5/2004 | Schlereth | ................ | H01L 33/08 257/100 |
| 6,955,933 B2 * | 10/2005 | Bour | ........................ | H01L 33/32 257/E33.008 |
| 7,058,105 B2 * | 6/2006 | Lee | ........................ | B82Y 20/00 257/E33.005 |
| 7,084,420 B2 * | 8/2006 | Kim | ........................ | B82Y 20/00 257/13 |
| 7,106,090 B2 * | 9/2006 | Harle | ..................... | B82Y 20/00 257/E33.008 |
| 7,279,717 B2 * | 10/2007 | Yamada | ................ | B82Y 20/00 257/13 |
| 7,724,795 B2 * | 5/2010 | Son | ........................ | B82Y 20/00 372/45.01 |
| 7,812,338 B2 * | 10/2010 | Ryu | ........................ | B82Y 20/00 257/13 |
| 7,868,316 B2 * | 1/2011 | Yoon | ....................... | H01L 33/06 257/14 |
| 7,902,544 B2 * | 3/2011 | Kim | ........................ | B82Y 20/00 257/103 |
| 7,977,665 B2 * | 7/2011 | Moon | ..................... | B82Y 20/00 257/14 |
| 8,008,647 B2 * | 8/2011 | Park | ........................ | B82Y 20/00 257/103 |
| 8,022,388 B2 * | 9/2011 | Brandes | .............. | H01L 25/0753 257/100 |
| 8,053,756 B2 * | 11/2011 | Nakahara | ................ | H01L 33/06 257/103 |
| 8,076,684 B2 * | 12/2011 | Taki | ........................ | B82Y 20/00 257/103 |
| 8,148,713 B2 * | 4/2012 | Sato | ..................... | H01L 21/0254 257/13 |
| 8,350,250 B2 * | 1/2013 | Kim | ........................ | B82Y 20/00 257/101 |
| 8,471,243 B1 * | 6/2013 | Arena | ............. | H01L 31/035236 257/13 |
| 8,575,592 B2 * | 11/2013 | Bergmann | .............. | H01L 33/04 257/13 |
| 8,686,398 B2 * | 4/2014 | Tanaka | .................... | H01L 33/06 257/13 |
| 8,704,251 B1 * | 4/2014 | Yen | ........................ | H01L 33/32 257/96 |
| 8,916,849 B2 * | 12/2014 | Eichler | ................... | B82Y 20/00 257/12 |
| 8,975,616 B2 * | 3/2015 | Wang | ..................... | B82Y 20/00 257/14 |
| 9,024,292 B2 * | 5/2015 | Li | ........................... | H01L 33/06 257/13 |
| 9,029,830 B2 * | 5/2015 | Senes | ..................... | H01L 33/06 257/13 |
| 9,048,362 B2 * | 6/2015 | Kimura | ................ | H01L 33/12 |
| 9,112,092 B2 * | 8/2015 | Won | ..................... | H01L 33/06 |
| 9,166,100 B2 * | 10/2015 | Han | ..................... | H01L 33/06 |
| 9,178,108 B2 * | 11/2015 | Moon | .................... | B82Y 20/00 |
| 9,246,057 B2 * | 1/2016 | Debray | ................... | H01L 33/32 |
| 9,343,626 B2 * | 5/2016 | Debray | ................... | H01L 33/32 |
| 9,373,750 B2 * | 6/2016 | Okuno | ................... | H01L 33/32 |
| 2008/0095492 A1 | 4/2008 | Son et al. | | |
| 2009/0045393 A1 * | 2/2009 | Nakahara | .......... | H01L 21/02403 257/13 |
| 2009/0224226 A1 * | 9/2009 | Huang | ..................... | H01L 33/06 257/13 |
| 2010/0270531 A1 | 10/2010 | Samal | | |
| 2013/0168638 A1 | 7/2013 | Park et al. | | |
| 2014/0120702 A1 | 5/2014 | Vaufrey et al. | | |
| 2015/0060904 A1 | 3/2015 | Robin et al. | | |
| 2015/0148213 A1 | 5/2015 | Chezaud et al. | | |

OTHER PUBLICATIONS

Ozgur et al., "Ballistic transport in InGaN-based LEDs: impact on efficiency", Semiconductor Science and Technology 26 (2011).*

Nakamura et al., "High-Brightness InGaN Blue, Green and Yellow Light-Emitting Diodes with Quantum Well Structures", Japanese Journal of Applied Physics 34 (1995) pp. L797-L799.*

Tong et al., "Efficiency enhancement of InGaN based blue light emitting diodes with InGaN/GaN multilayer barriers", Chinese Physics B 21 (2012).*

U.S. Appl. No. 14/748,707, filed Jun. 24, 2015, Hubert Bono, et al.

U.S. Appl. No. 14/750,156, filed Jun. 25, 2015, Ivan-Christophe Robin, et al.

International Search Report dated May 28, 2014 in PCT/EP14/055964 filed Mar. 25, 2014.

French Search Report dated Dec. 11, 2013 in French Application No. 13 52839 filed Mar. 28, 2013.

* cited by examiner

LIGHT-EMITTING DIODE WITH MULTIPLE QUANTUM WELLS AND ASYMMETRIC P-N JUNCTION

TECHNICAL FIELD AND PRIOR ART

The invention relates to the field of light-emitting diodes (LED) with multiple quantum wells.

FIG. 1 diagrammatically shows a diode 10 with multiple quantum wells according to prior art.

This diode 10 comprises a p-n junction formed from a first n-doped (GaN-n) GaN layer 12 with a concentration equal to $10^{19}$ donors/cm$^3$ and a second p-doped GaN (GaN-p) layer 14 with a concentration equal to $2 \times 10^{19}$ acceptors/cm$^3$, these two layers each for example being several microns thick.

Several emissive layers 16 are arranged between the layers 12 and 14. The diode 10 described herein comprises three emissive layers 16 shown as referenced 16.1, 16.2 and 16.3 in FIG. 1, each forming a quantum well. The emissive layers 16 comprise $In_{0.16}Ga_{0.84}N$ (comprising 16% indium with 84% gallium) that is not intentionally doped (with a residual donor concentration $n_{nid}=10^{17}$ cm$^{-3}$) and have a thickness equal to 1 nm. Barrier layers 18 (there are four of them in the diode 10 referenced 18.1, 18.2, 18.3 and 18.4) comprising GaN that is not intentionally doped (with a residual donor concentration $n_{nid}=10^{17}$ cm$^{-3}$) and having a thickness equal to 5 nm are also located between the layers 12 and 14. Two of the four barrier layers 18 are interposed each between two consecutive emissive layers 16 and each of the other two barrier layers 18 is interposed between one of the emissive layers 16 and one of the layers 12 and 14. The diode 10 is polarised by taking electrical contacts on the side of the first layer 12 (that then forms a cathode of the diode 10) and the second layer 14 (forming an anode of the diode 10). The 0 V band structure of the diode 10 thus polarised within the different layers of the diode 10 is shown in FIG. 2. In this figure, the conduction band in eV has reference 20 and the valence band also in eV has reference 22. The I(V) characteristic of the diode 10, in other words the value of the current density at the anode of diode 10 as a function of the voltage at the anode of diode 10, is shown in FIG. 3. FIG. 3 shows that a polarisation voltage of 3.2 V applied between the anode and the cathode of the diode 10 can give a current density at the anode of the diode 10 equal to 250 A/cm$^2$ that typically corresponds to the required current density in a very bright light-emitting diode.

FIG. 4 shows the radiative recombination ratio on a logarithmic scale per cm$^3$·s, obtained in the different layers of the diode 10 with this polarisation voltage of 3.2 V applied between the anode and the cathode of the diode 10. This figure shows that a recombination ratio of about $10^{22}$ cm$^{-3}$s$^{-1}$ is obtained in the quantum well formed by the third emissive layer 16.3. On the other hand, this radiative recombination ratio drops to about $10^{23}$ cm$^{-3}$s$^{-1}$ in the second emissive layer 16.2 and to about $1 \times 10^{19}$ cm$^{-3}$s$^{-1}$ in the first emissive layer 16.1. Therefore the light emission obtained with the diode 10 is very badly distributed between the three quantum wells of the diode 10.

This bad distribution of light emission in the diode 10 is due to a non-uniform distribution of charges and particularly holes between the different quantum wells because the radiative recombination ratio in the quantum wells is directly proportional to the product of the concentration of holes and electrons in the quantum wells. FIG. 5 shows concentrations of electrons (represented by crosses referenced 24) and holes (represented by diamonds referenced 26) per cm$^3$, obtained in the different layers of the diode 10 polarised as above with a voltage of 3.2 V. It can be seen in this FIG. 5 that electrons tend to pass into the second GaN-p layer 14 which reduces the radiative recombination ratio in the quantum wells of the diode 10. It is known that this problem can be mitigated by interposing an electron blocking layer comprising AlGaN between the fourth barrier layer 18.4 and the second GaN-p layer 14. On the other hand, it can also be seen in this figure that holes are not uniformly distributed in the quantum wells: there are about $10^{19}$ holes/cm$^3$ in the quantum well formed by the third emissive layer 16.3 located on the side facing the second GaN-p layer 14 whereas there are about $10^{17}$ holes/cm$^3$ in the quantum well formed by the second emissive layer 16.2 and about $10^{14}$ holes/cm$^3$ in the quantum well formed by the first emissive layer 16.1 located on the side facing the first GaN-n layer 12. However, the electron concentration in the different quantum wells is uniform and is equal to about $10^{19}$ cm$^{-3}$. The fact that light emission of the diode 10 originates only from the quantum well formed by the third emissive layer 16.3 on the side facing the second GaN-p layer 14 is due to the fact that the holes are not distributed uniformly among the different quantum wells of the diode 10.

The internal quantum efficiency of the diode 10 that corresponds to the ratio between the number of injected electrons and the number of photons emitted by the quantum wells of the diode 10 as a function of the current density (in A/cm$^2$) in the diode 10 is shown in FIG. 6. It can be seen in this figure that the maximum internal quantum efficiency of the diode 10 is about 4% and it is obtained for a current density of about 600 A/cm$^2$. This internal quantum efficiency is limited by:

- non-radiative Auger and Shockley-Read-Hall type recombinations occurring in the diode 10,
- electrons escaping from the quantum wells to the second GaN-p layer 14,
- and also due to the fact that light emission is not uniform in the different quantum wells of the diode.

Presentation of the Invention

One purpose of this invention is to disclose a light-emitting diode with multiple quantum wells with a better internal quantum efficiency than light-emitting diodes according to prior art.

This is done by disclosing a light-emitting diode comprising:

- a first n-doped semiconductor layer capable of forming a cathode of the diode and a second p-doped semiconductor layer capable of forming an anode of the diode such that the first layer and the second layer form a p-n junction of the diode;
- an active zone located between the first layer and the second layer including at least two emissive layers comprising the semiconductor and capable of forming quantum wells, and a plurality of semiconductor barrier layers such that each emissive layer is located between two barrier layers that are in contact with said emissive layer at two opposite faces of said emissive layer;
- an n-doped semiconductor buffer layer located between the first layer and the active zone, said n-doped semiconductor in the buffer layer having a band gap energy less than or equal to about 97% of the band gap energy of the p-doped semiconductor in the second layer.

The invention also discloses a light-emitting diode comprising:

a first n-doped semiconductor layer capable of forming a cathode of the diode and a second p-doped semiconductor layer capable of forming an anode of the diode, the first and the second layer forming a p-n junction of the diode;

an active zone located between the first layer and the second layer, including at least two emissive layers comprising the semiconductor and capable of forming quantum wells and a plurality of semiconductor barrier layers such that each emissive layer is located between two barrier layers that are in contact with said emissive layer at the two opposite faces of said emissive layer;

an n-doped semiconductor buffer layer located between the first layer and the active zone, said n-doped semiconductor of the buffer layer having a band gap energy less than or equal to about 97% of the band gap energy of the p-doped semiconductor in the second layer;

in which the semiconductor of the barrier layers is $In_XGa_{1-X}N$, the semiconductor of the buffer layer is $In_ZGa_{1-Z}N$, and the semiconductor of the emissive layers is $In_YGa_{1-Y}N$, where x, y and z are real numbers such that $0.025 \leq x$, and $0.025 \leq z$, and $0.1 \leq y$, and $x<y$, and $z<y$, or in which, when the diode comprises m barrier layers, the semiconductor in each of the barrier layers is $In_{Xi}Ga_{1-Xi}N$, where i is an integer number between 1 and m, the semiconductor of the buffer layer is $In_ZGa_{1-Z}N$, and the semiconductor of the emissive layers is $In_YGa_{1-Y}N$, where $x_i$, y and z are real numbers such that $0.025 \leq z$, and $0.1 \leq y$, and $x_i<y$, and $z<y$, and in which the indium composition $x_i$ in the semiconductor of each barrier layer is different from the indium composition of the other barrier layers, these indium compositions gradually varying and decreasing from a first value $x_1$, corresponding to the indium composition in the semiconductor of one of the barrier layers in contact with the buffer layer, such that $x_1 \leq z$, up to another value $x_m$ corresponding to the indium composition in the semiconductor of one of the barrier layers in contact with the second layer such that $x_m<x_1$, and where $m \geq 3$.

Unlike light-emitting diodes with multiple quantum wells according to prior art, the light-emitting diode according to the invention comprises an n-doped semiconductor buffer layer creating asymmetry in the structure of the diode and more particularly asymmetry in the p-n junction of the diode, due to its band gap energy less than or equal to about 97% of the band gap energy of the second layer, in other words such that the gap of the buffer layer is at least 3% less than the gap of the second p-doped semiconductor layer of the p-n junction ($Eg_{110} \leq 0.97 \, Eg_{104}$). This asymmetry facilitates circulation of holes in the diode so that a uniform distribution of carriers (electrons and holes) can be obtained in the different quantum wells in the active zone of the diode. This results in a homogeneous light emission in the different quantum wells of the diode and therefore a better internal quantum efficiency of the diode.

Preferably, the buffer layer gap is at least 2% larger than the gap of the emissive layers or quantum wells, thus improving confinement in the quantum wells ($Eg_{110} \geq 1.02 \, Eg_{106}$).

The n-doped semiconductor of the first layer and/or the p-doped semiconductor of the second layer may be GaN, and/or the semiconductors of the emissive layers and/or the barrier layers and/or the buffer layer may be InGaN.

An indium concentration in the n-doped semiconductor of the buffer layer, for example containing InGaN, may be at least 2.5% more than the indium concentration in the p-doped semiconductor of the second layer for example including GaN (in this case with a zero indium concentration in the p-doped semiconductor of the second layer) or InGaN.

The buffer layer and the first layer may comprise a semiconductor with an identical composition and/or doping. Thus, the indium composition, in other words the percentage of indium, in the n-doped semiconductor of the first layer may be similar to the indium composition in the semiconductor of the buffer layer, and/or the concentration of donors in the n-doped semiconductor of the first layer may be similar to the concentration of donors in the n-doped semiconductor of the buffer layer.

The semiconductor of the barrier layers may be $In_XGa_{1-X}N$, the semiconductor of the buffer layer may be $In_ZGa_{1-Z}N$, and the semiconductor in the emissive layers may be $In_YGa_{1-Y}N$, where x, y and z are real numbers such that $0.025 \leq x \leq 0.13$, or $0.025 \leq x \leq 0.3$, and $0.025 \leq z \leq 0.13$ or $0.025 \leq z \leq 0.3$, and $0.1 \leq y \leq 0.3$ or $0.1 \leq y \leq 0.5$, and $x<y$, and $z<y$.

The buffer layer may be more than about 5 nm thick.

When the diode contains a number n of emissive layers such that $2 \leq n \leq 5$, the semiconductors of the barrier layers and emissive layers may be such that $(x+0.03) \leq y$.

As a variant, when the diode comprises a number n of emissive layers such that $5 \leq n \leq 10$ the semiconductors of the barrier layers and the emissive layers may be such that $x \leq 0.04$ and $(x+0.03) \leq y$, and/or the thickness of the buffer layer may be more than about 20 nm.

As a variant, when the diode comprises a number n of emissive layers such that $n \geq 10$ the semiconductors of the barrier layers and the emissive layers may be such that $x \geq 0.06$ and $(x+0.03) \geq y$, and/or the thickness of the buffer layer may be more than about 20 nm.

The barrier layers may all comprise a semiconductor with the same composition. It is also possible that $z=x$ or $z \geq x$ (and therefore that the gap energy of the buffer layer is less than or equal to the gap energy of the barrier layers) in other words the indium composition of the semiconductor in the buffer layer is approximately equal to or is greater than the indium composition in the semiconductor of the barrier layers. This is even more conducive to the passage of holes and therefore homogenisation of emission in the wells.

As a variant, when the diode comprises m barrier layers, the semiconductor of each barrier layer may be $In_{Xi}Ga_{1-Xi}N$, where i is an integer number between 1 and m, the semiconductor of the buffer layer may be $In_ZGa_{1-Z}N$, and the semiconductor of emissive layers may be $In_YGa_{1-Y}N$, where $x_i$, y and z are real numbers such that $0.025 \leq z \leq 0.13$ or $0.025 \leq z \leq 0.3$, and $0.1 \leq y \leq 0.3$ or $0.1 \leq y \leq 0.5$, and $x_i<y$, and $z<y$, and in which the indium composition $x_i$ in the semiconductor of each barrier layer may be different from the indium composition of the other barrier layers, these indium compositions possibly varying gradually and decreasing from a first value $x_1$, corresponding to the indium composition in the semiconductor of one of the barrier layers in contact with the buffer layer, such that $x_1=z$ or $x_1 \leq z$, up to another value $x_m$ corresponding to the indium composition in the semiconductor of one of the barrier layers in contact with the second layer such that $x_m<x_1$, and where $m \geq 3$.

When the diode comprises a number n of emissive layers such that $2 \leq n \leq 5$, the semiconductors of the barrier layers and the emissive layers may be such that $x_1>0.04$ and $x_m \geq 0.005$, and $(x_1+0.03) \leq y$.

As a variant, when the diode comprises a number n of emissive layers such that $5 \leq n \leq 10$, the semiconductors of the barrier layers and the emissive layers may be such that $x_1>0.08$ and $x_m \geq 0.005$ and $(x_1+0.03) \leq y$, and/or the thickness of the buffer layer may be greater than about 20 nm.

As a variant, when the diode comprises a number n of emissive layers such that n≥10 the semi-conductors of the barrier layers and of emissive layers may be such that $x_1>0.12$ and $x_m \geq 0.025$ and $(x_1+0.03) \leq y$, and/or the thickness of the buffer layer may be greater than about 20 nm.

The indium composition z in the semiconductor of the buffer layer may vary between a first value $z_1$ and a second value $z_2$ greater than the first value $z_1$ along a direction approximately perpendicular to a first face of the buffer layer in contact with which the first layer is located, and the indium composition z at the first face of the buffer layer may be equal to the first value $z_1$, and when the indium composition in the semiconductor of each of the barrier layers is different from the indium composition of the other barrier layers, the indium composition $x_1$ may be such that $x_1=z_2$ or $x_1 \leq z_2$.

In this case, the indium composition z in the semiconductor of the buffer layer may vary by increasing between $z_1$ and $z_2$, where $z_1=0$ and $z_2=x$ or $z_2 \geq x$ or $Z_2=x_1$ or $Z_2 \geq x_1$.

As a variant, the indium composition z in the semiconductor of the buffer layer may vary by increasing between $z_1$ and a third value $z_3 > z_2$, and may vary by decreasing between $z_3$ and $z_2$, where $z_1=0$ and $z_2=x$ or $z_2 \geq x$ or $z_2=x_1$ or $z_2 \geq x_1$.

The p-doped semiconductor of the second layer may be $In_w Ga_{1-w} N$, where w is a real number such that $w<0.12$ and in which when the semiconductor of the barrier layers is $In_X Ga_{1-X} N$, and the semiconductor of the buffer layer is $In_Z Ga_{1-Z} N$, and the semiconductor of emissive layers is $In_Y Ga_{1-Y} N$, the indium compositions w, x, y and z may be such that $(0.025+w) \leq x$, and $(0.025+w) \leq z$, and $(0.1+w) \leq y$, or such that $(0.025+w) \leq x \leq (0.13+w)$, and $(0.025+w) \leq z \leq (0.13+w)$, and $(0.1+w) \leq y \leq (0.3+w)$, or such that $(0.025+w) \leq x \leq (0.3+w)$, and $(0.025+w) \leq z \leq (0.3+w)$, and $(0.1+w) \leq y \leq (0.5+w)$.

BRIEF DESCRIPTION OF THE DRAWINGS

This invention will be better understood after reading the description of example embodiments given purely for information and in no way limitative with reference to the appended drawings in which.

Identical, similar or equivalent parts of the different figures described below have the same numeric references to facilitate reading the different figures.

The different parts shown in the figures are not necessarily all at the same scale, to make the figures more readable.

The different possibilities (variants and embodiments) must be understood as not being exclusive of each other and can be combined with each other.

DETAILED PRESENTATION OF PARTICULAR EMBODIMENTS

Figure 1:
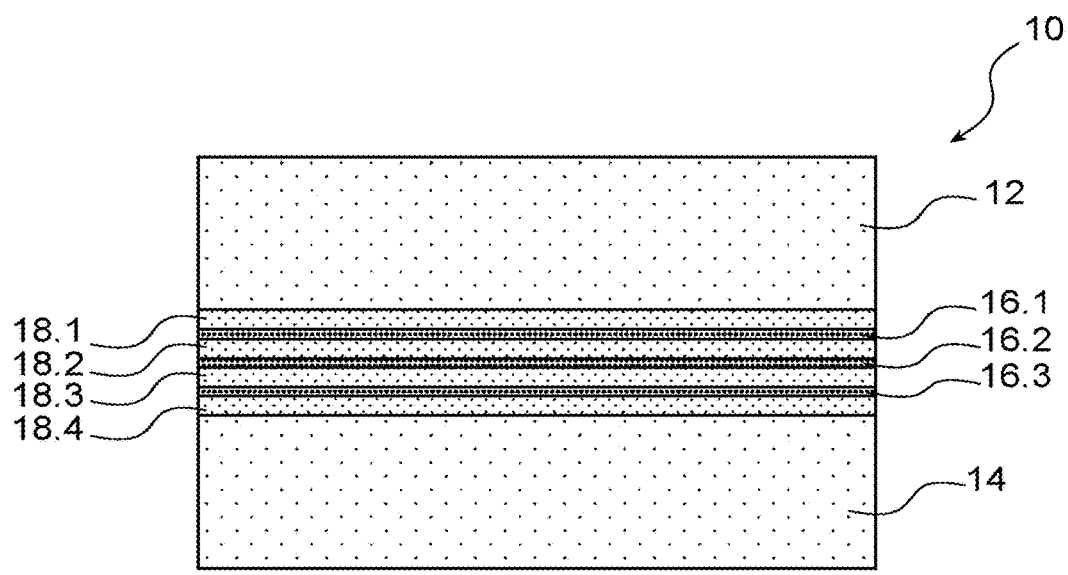
FIG. 1 shows a light-emitting diode with multiple quantum wells according to prior art.
Figure 2:
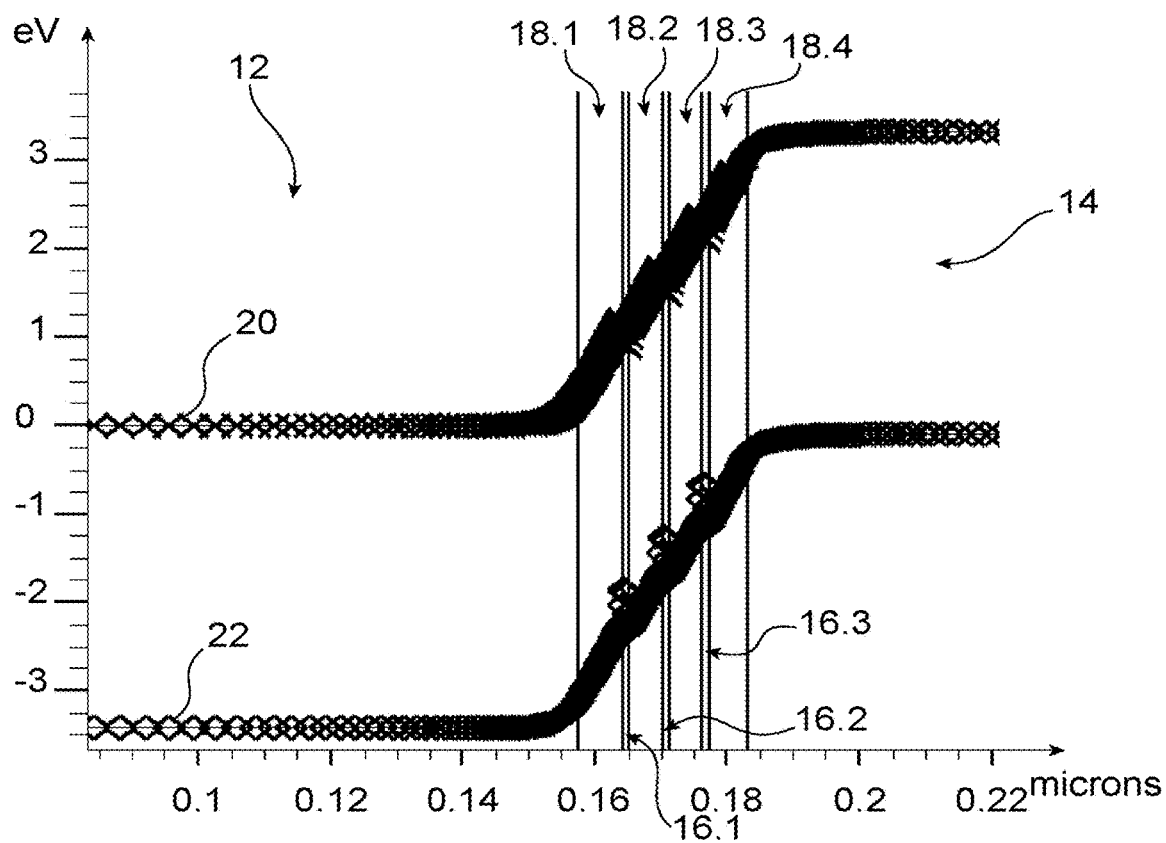
FIG. 2 shows the band structure within the different layers of the light-emitting diode shown in FIG. 1.
Figure 3:
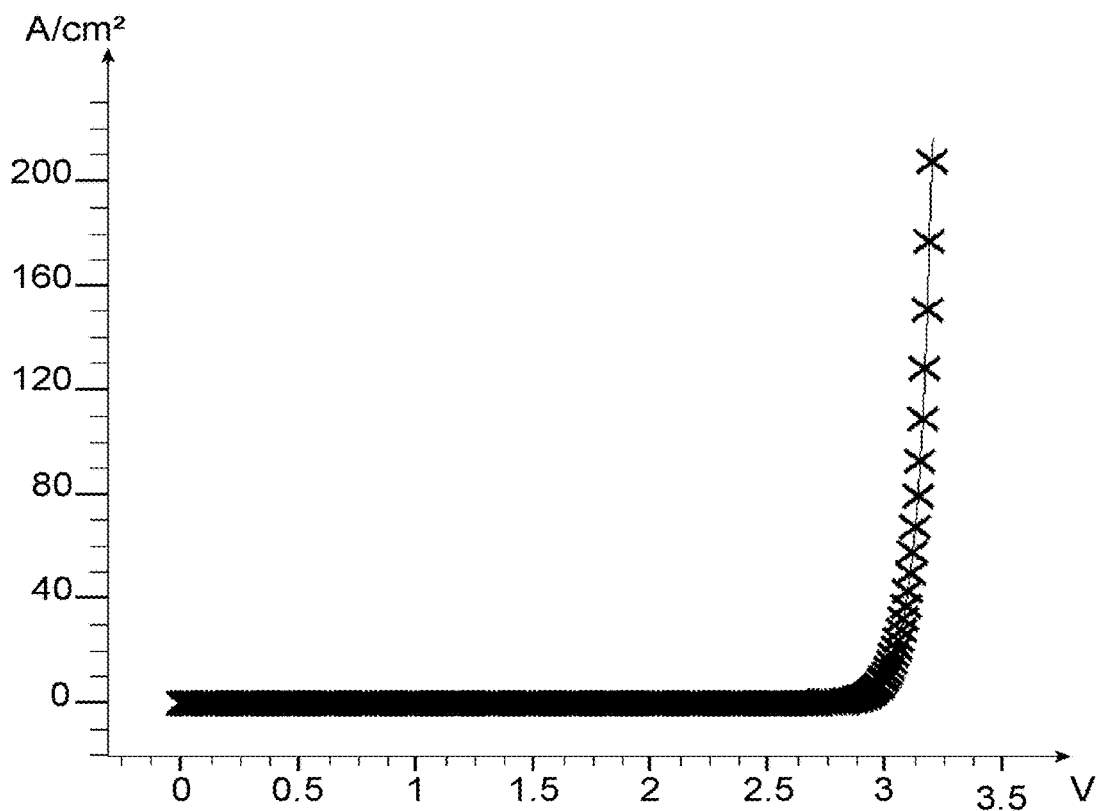
FIG. 3 shows the I(V) characteristic of the light-emitting diode shown in FIG. 1.
Figure 4:
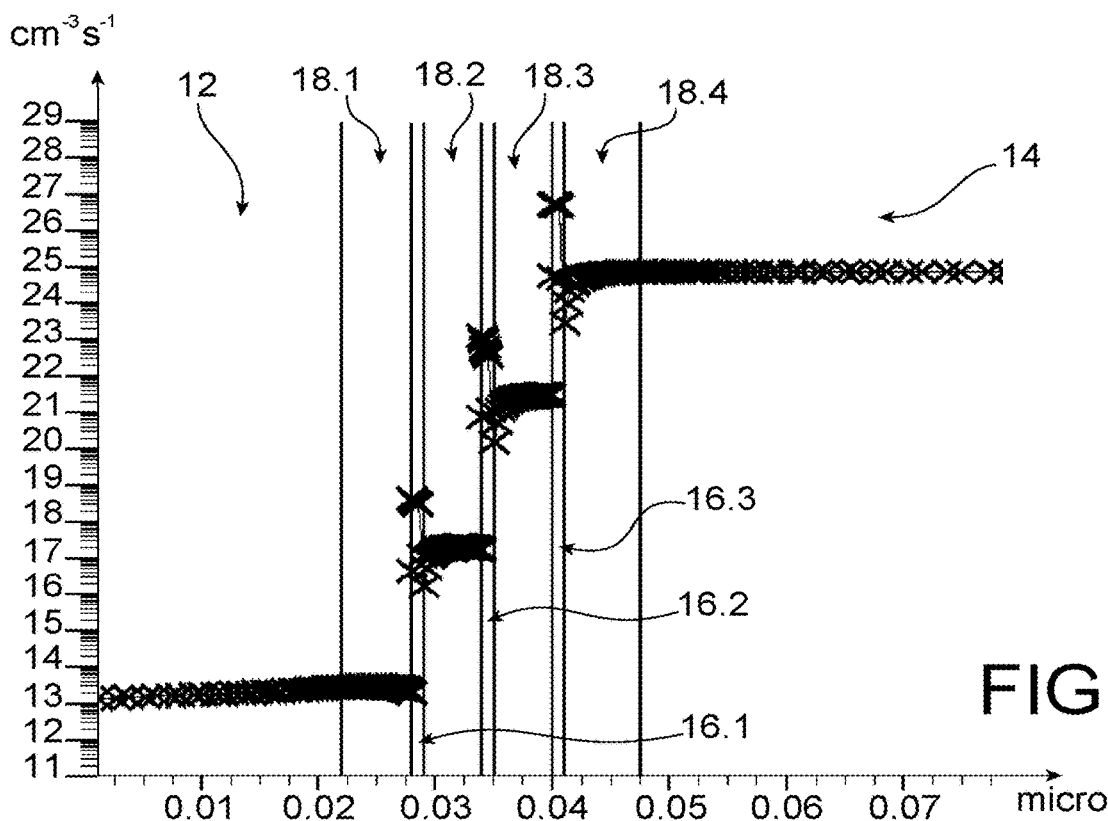
FIG. 4 shows the radiative recombination ratio within the different layers of the light-emitting diode shown in FIG. 1.
Figure 5:
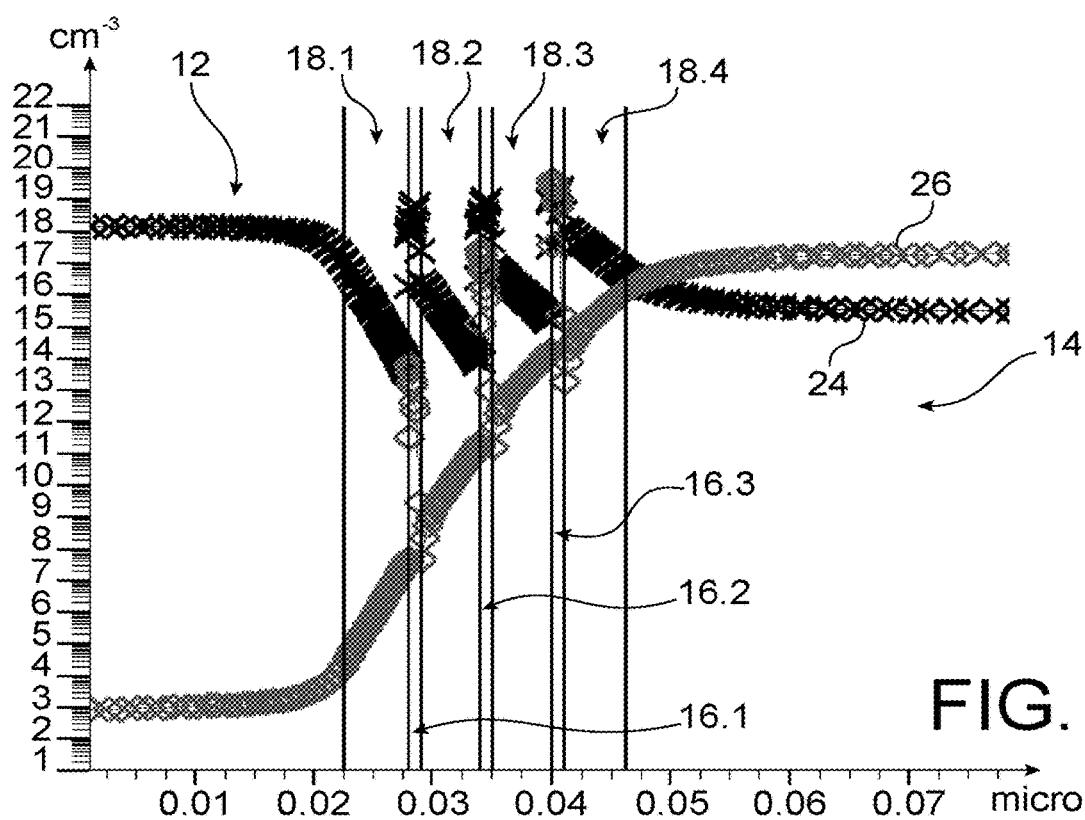
FIG. 5 shows the concentration of electrons and holes within the different layers of the light-emitting diode shown in FIG. 1.
Figure 6:
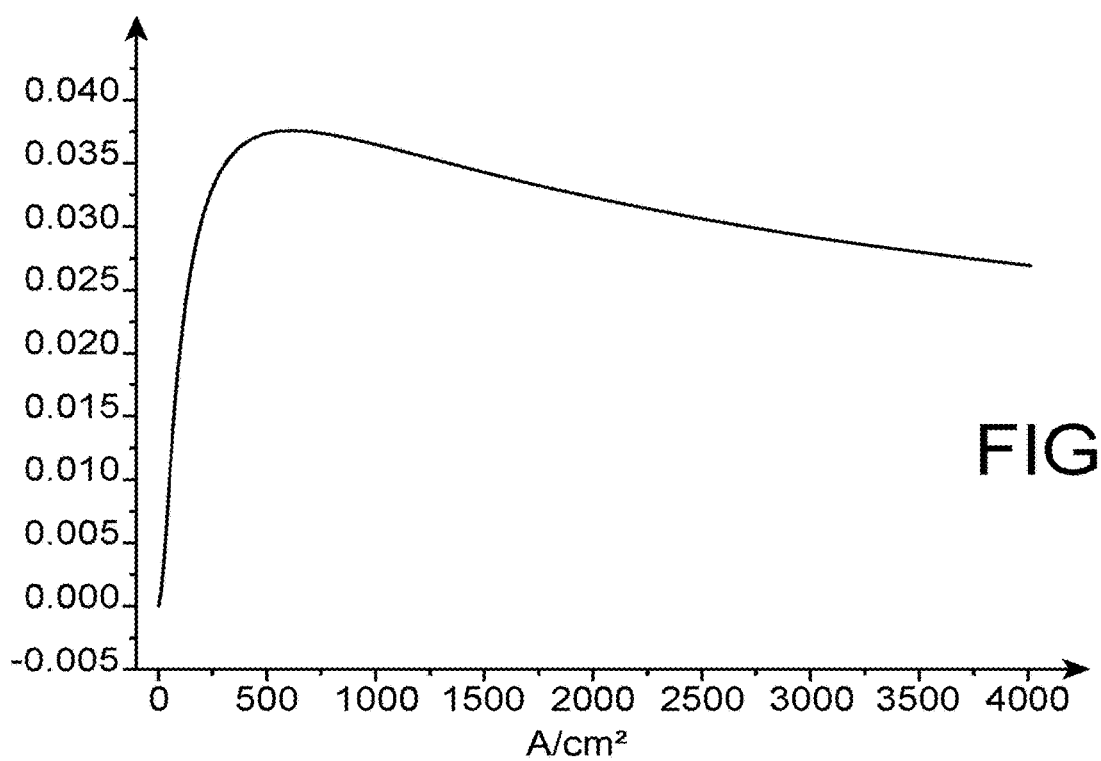
FIG. 6 shows the internal quantum efficiency of the light-emitting diode shown in FIG. 1 as a function of the current density at the anode of the light-emitting diode, FIG. 7 diagrammatically shows a light-emitting diode according to a particular embodiment of this invention.
Figure 7:
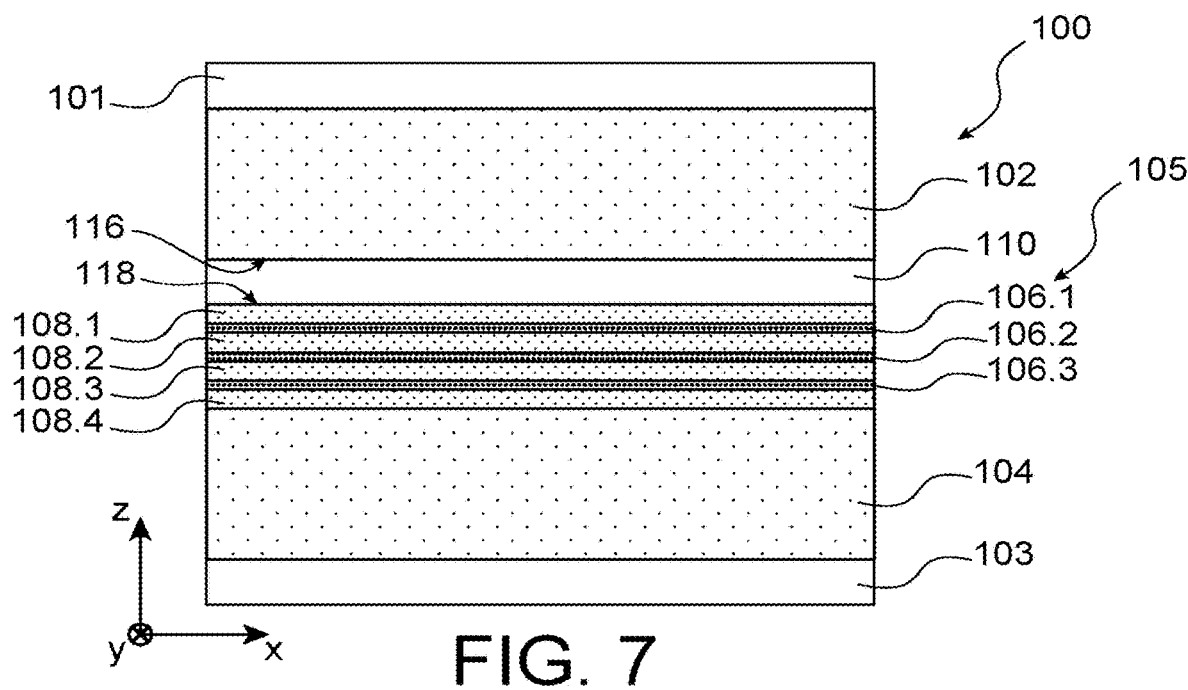

Refer firstly to FIG. 7 that shows a light-emitting diode 100 with multiple quantum wells according to one particular embodiment.

The diode 100 comprises a p-n junction formed by a first layer 102 comprising n-doped GaN (GaN-n) with a concentration of donors equal to about $10^{19}$ donors/cm³ and a second layer 104 comprising p-doped GaN (GaN-p) with a concentration of acceptors equal to about $2 \times 10^{19}$ acceptors/cm³. For example, the thickness (dimension along the Z axis shown in FIG. 7) of each of these two layers 102 and 104 may be between about 20 nm and 10 μm. A first metallic electrode 101 is located in contact with the first layer 102 and forms a cathode of the diode 100 and a second metallic electrode 103 is in contact with the second layer 104 and forms an anode of the diode 100. In general, the concentration of donors in the first layer 102 may be between about $10^{17}$ and $10^{20}$ donors/cm³, and the concentration of acceptors in the second layer 104 may be between about $10^{15}$ and $10^{20}$ acceptors/cm³.

The diode 100 comprises an active zone 105 between layers 102 and 104 comprising several emissive layers 106. The diode 100 described herein comprises three emissive layers 106 referenced 106.1, 106.2 and 106.3, each forming a quantum well. In general, the diode 100 may comprise n emissive layers 106 where n is an integer number such that $2 \leq n \leq 20$. The emissive layers 106 in this case comprise $In_{0.16}Ga_{0.84}N$ (in other words comprising 16% indium for 84% gallium) not intentionally doped (with a residual donor concentration $n_{nid}=10^{17}$ cm$^{-3}$) and a thickness equal to about 1 nm. The active zone 105 of the diode 100 also comprises barrier layers 108 (there are four of them in the diode 100 shown in FIG. 7, referenced 108.1, 108.2, 108.3 and 108.4) comprising $In_{0.05}Ga_{0.95}N$ (comprising 5% indium for 95% gallium) not intentionally doped (the residual donor concentration $n_{nid}=10^{17}$ cm$^{-3}$) with a thickness equal to about 5 nm. Two of the four barrier layers 108 are interposed each between two consecutive emissive layers 106 and the other two barrier layers 108 are each interposed between one of the emissive layers 106 and one of the layers 102 and 104. Thus, a first barrier layer 108.1 is arranged between the first GaN-n layer 102 and the first emissive layer 106.1. A second barrier layer 108.2 is located between the first emissive layer 106.1 and the second emissive layer 106.2. A third barrier layer 108.3 is located between the second emissive layer 106.2 and the third emissive layer 106.3. A fourth barrier layer 108.4 is located between the third emissive layer 106.3 and the second GaN-p layer 104. Therefore in general, the diode 100 that comprises n emissive layers 106 comprises m barrier layers 108 where m is an integer number equal to n+1. The active zone 105 is formed from the stack of n emissive layers 106 alternating with n+1 barrier layers 108. The residual donor concentrations in layers 106 and 108 may be between about $10^{17}$ and $10^{20}$ donors/cm³.

The diode 100 also comprises a buffer layer 110 located between the active zone 105 and the first GaN-n layer 102 and particularly between the first barrier layer 108.1 and the first GaN-n layer 102. This buffer layer 110 comprises $In_{0.05}Ga_{0.95}N$, for example corresponding to the same semiconductor as the barrier layers 108. On the other hand, unlike the barrier layers 108, the semiconductor of the buffer layer 110 is n-doped with a donor concentration equal to about $10^{19}$ donors/cm³, in other words in this case with a concentration of dopants similar to the concentration of dopants in GaN-n in the first layer 102. For example, the thickness of the buffer layer 110 (dimension along the Z axis shown in FIG. 7) may be between about 5 nm and 10 µm. In general, the buffer layer 110 may have a donor concentration equal to between $10^{17}$ and $10^{20}$ donors/cm³ and typically $10^{19}$ donors/cm³.

The different simulations described below are made using the ATLAS SILVACO® simulation software.

Figure 8:
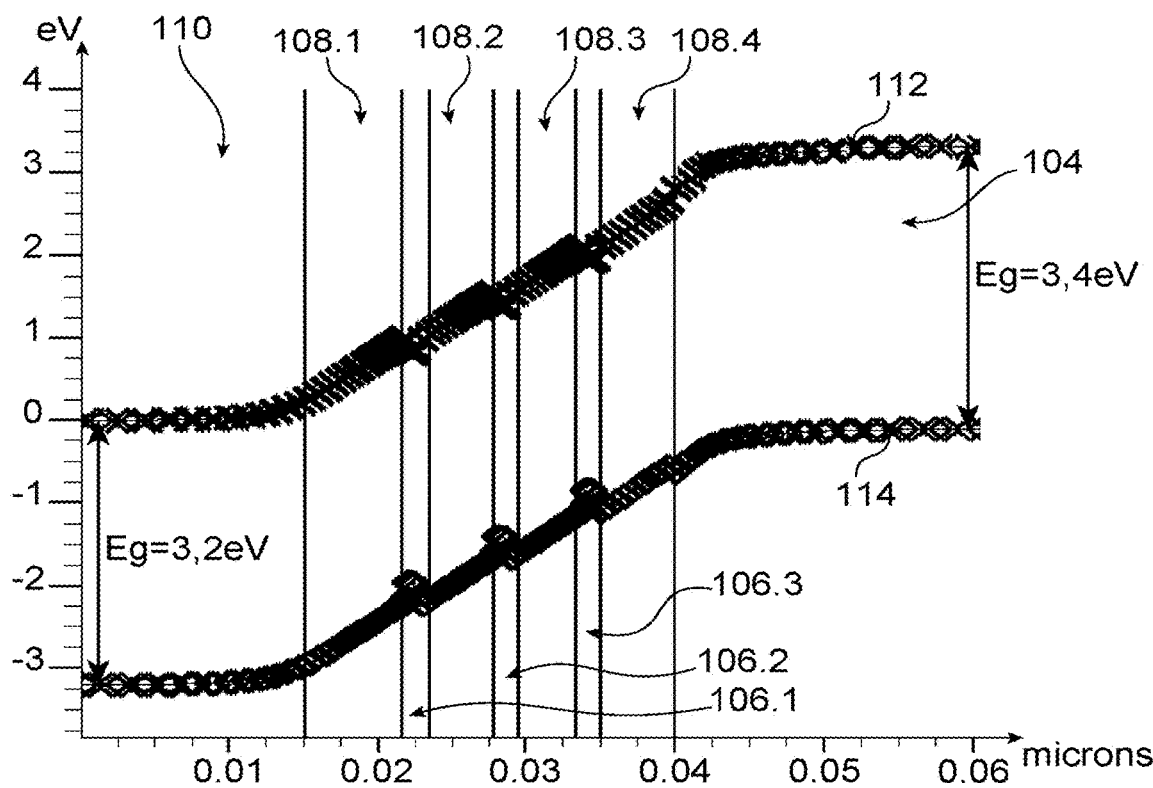
FIG. 8 shows the band structure within the different layers of the light-emitting diode according to this invention shown in FIG. 7.

The band structure at 0 V of the polarised diode 100 within the different layers of the diode 100 (except for the first layer 102) is shown in FIG. 8. In this figure, the conduction band in eV has reference 112 and the valence band also in eV has reference 114. The left part of these bands corresponding to the conduction and valence bands in the buffer layer 110 has a gap Eg equal to about 3.2 eV in the buffer layer 110. The right part of these bands corresponding to bands in the second layer 104 of GaN-p, has a gap Eg equal to about 3.4 eV in the second layer 104. This gap difference ($Eg_{110}$ is equal to about $0.94 \cdot Eg_{104}$) is obtained mainly due to the presence of the buffer layer 110 between the first GaN-n layer 102 and the active zone 105, and due to the indium present in the semiconductor of the barrier layers 108. The presence of the buffer layer 110 between the active zone 105 and the first GaN-n layer 102 creates asymmetry in the p-n junction of the diode 100. Consequently, the barrier to be crossed for holes to be able to circulate as far as the buffer layer 110 is then only 3.2 eV whereas it is still 3.4 eV for the electrons. This makes it possible to distribute the holes uniformly in all quantum wells of the diode 100. Furthermore, the gap in the buffer layer 110 is preferably at least 2% larger than the gap in the emissive layers 106 or quantum wells, thus improving confinement in the wells ($Eg_{110} \geq 1.02\ Eg_{106.1}$; $Eg_{110} \geq 1.02\ Eg_{106.2}$; $Eg_{110} \geq 1.02\ Eg_{106.3}$ in the example described herein).

Figure 9:
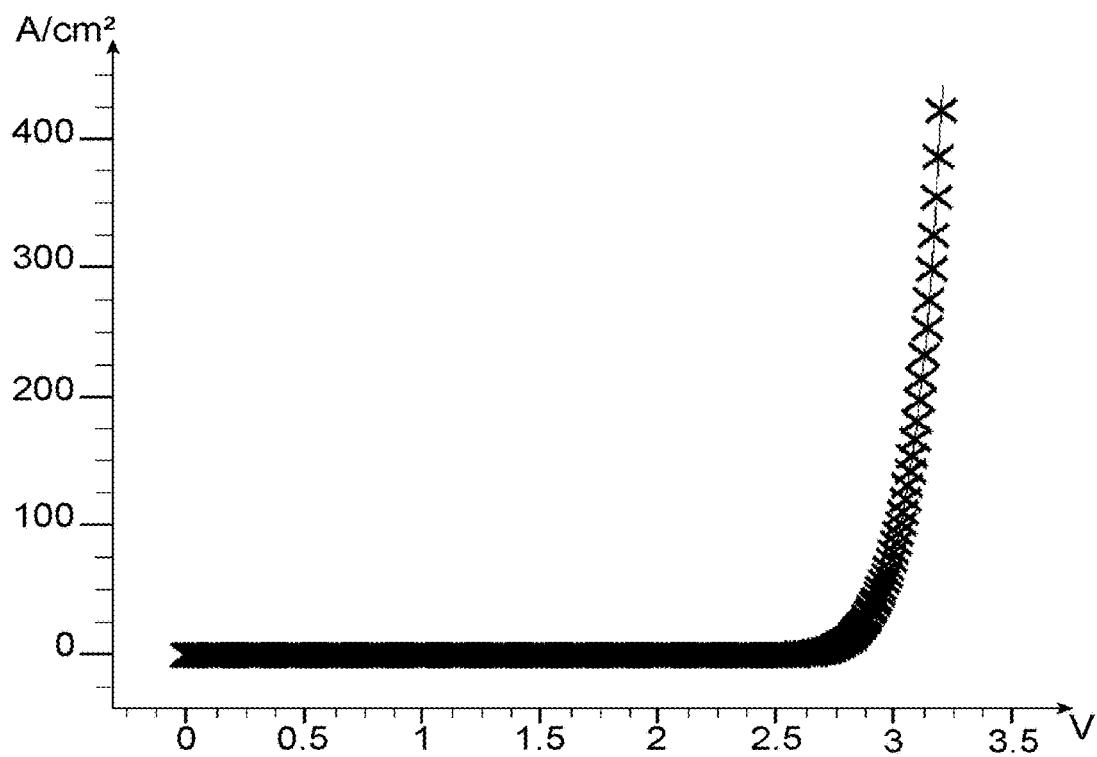
FIG. 9 shows the I(V) characteristic of the light-emitting diode according to this invention shown in FIG. 7.

The I(V) characteristic of the diode 100, in other words the value of the current density at the anode of the diode 100 as a function of the voltage at the anode of the diode 100, is shown in FIG. 9. FIG. 9 shows that a polarisation voltage equal to about 3.2 V applied between the anode and the cathode of the diode 100 can give a current density equal to about 450 A/cm², which is much more than the current density of 250 A/cm² obtained with the diode 10 according to prior art. This high current density is due to the fact that the uniform distribution of holes in the set of quantum wells of the diode 100 strongly increases the radiative recombination ratio within the quantum wells of the diode 100.

Figure 10:
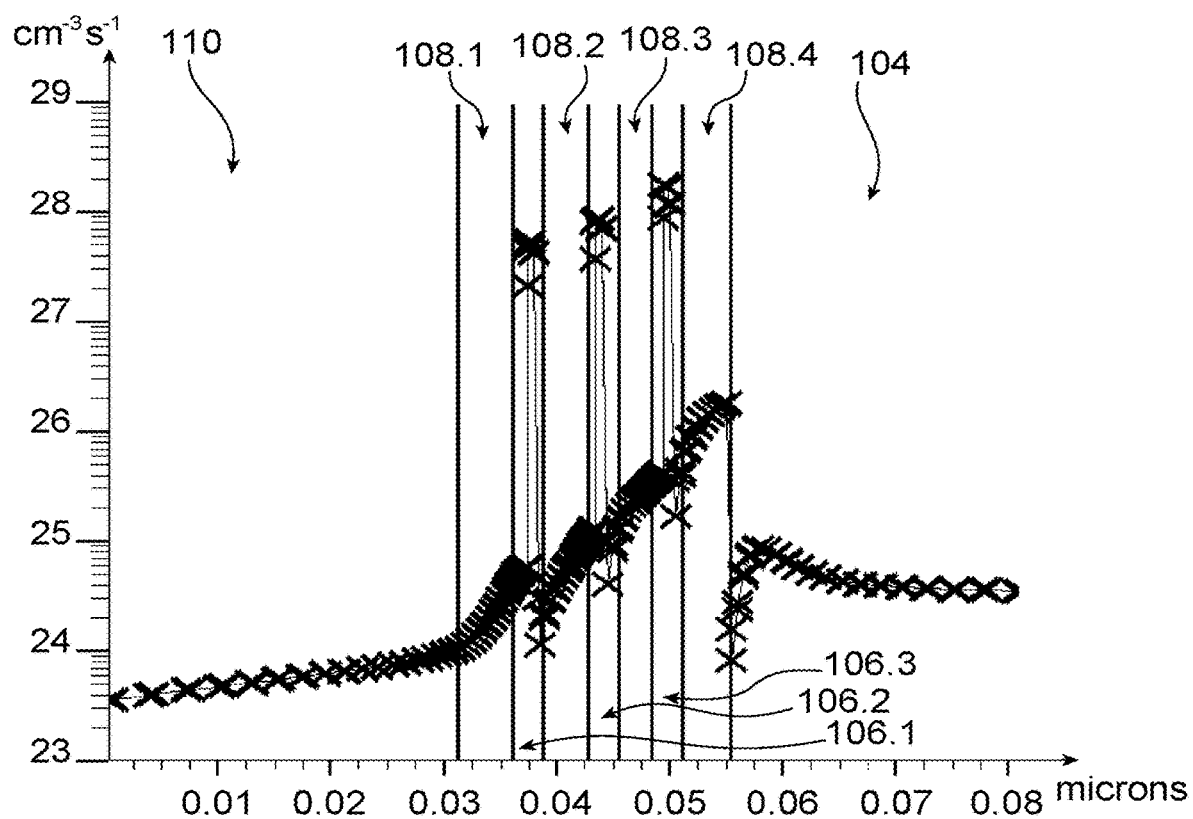
FIG. 10 shows the radiative recombination ratio within the different layers of the light-emitting diode according to this invention shown in FIG. 7.

FIG. 10 shows the ratio of radiative recombinations in a logarithmic scale and per cm³·s, obtained in the different layers (except for the first layer 102) of the diode 100 with this polarisation voltage of 3.2 V applied between the anode and the cathode of the diode 100. This figure shows that a radiative recombination ratio equal to about $10^{28}$ cm⁻³s⁻¹ is obtained in the three quantum wells formed by the three emissive layers 106.1, 106.2 and 106.3 of the diode 100. Therefore light emission obtained in the diode 100 is distributed uniformly in the three quantum wells of the diode 100.

Figure 11:
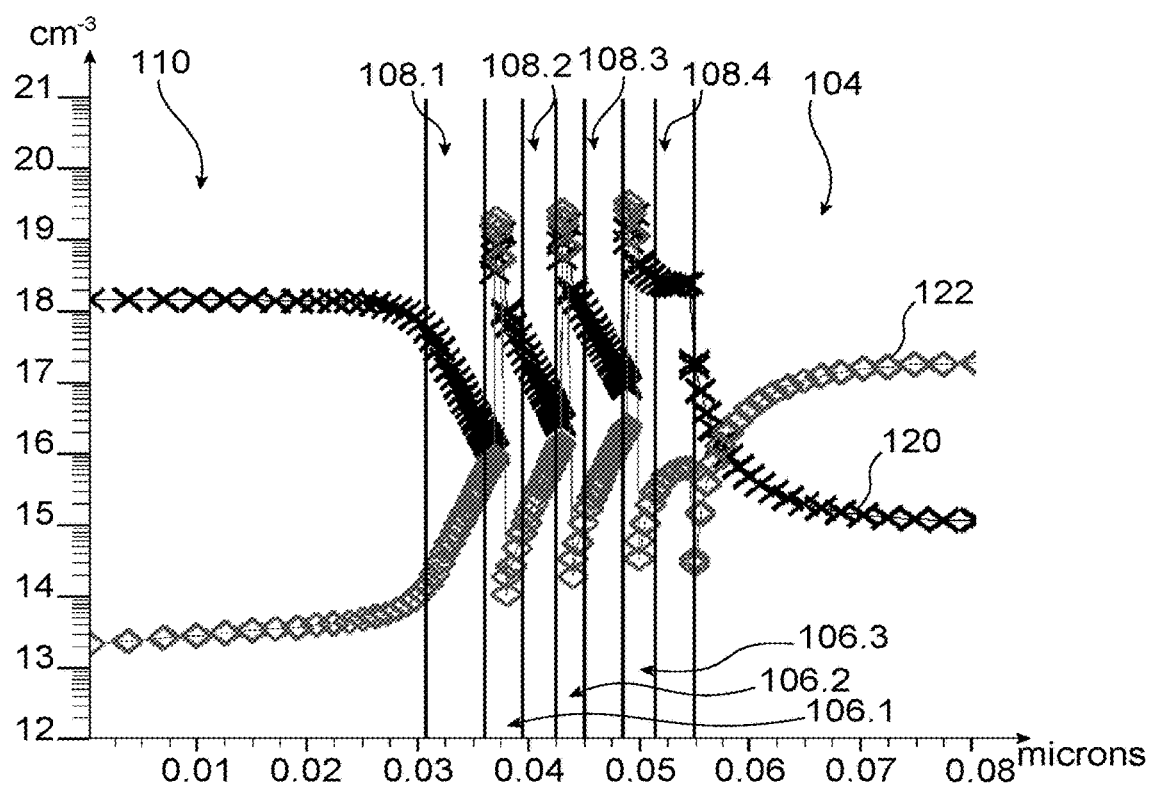
FIG. 11 shows concentrations of electrons and holes within the different layers of the light-emitting diode according to this invention, shown in FIG. 7.

FIG. 11 shows concentrations of electrons (represented by crosses referenced 120) and holes (represented by diamonds referenced 122) per cm³, obtained in the different layers of the diode 100 polarised as above at a voltage of 3.2 V. This figure shows that the electron and hole concentrations are equivalent in all quantum wells of the diode 100 (concentrations equal to about $10^{19}$ cm⁻³), because the energy barrier to be overcome for holes is lowered thus facilitating their diffusion in all quantum wells of the diode 100.

Figure 12:
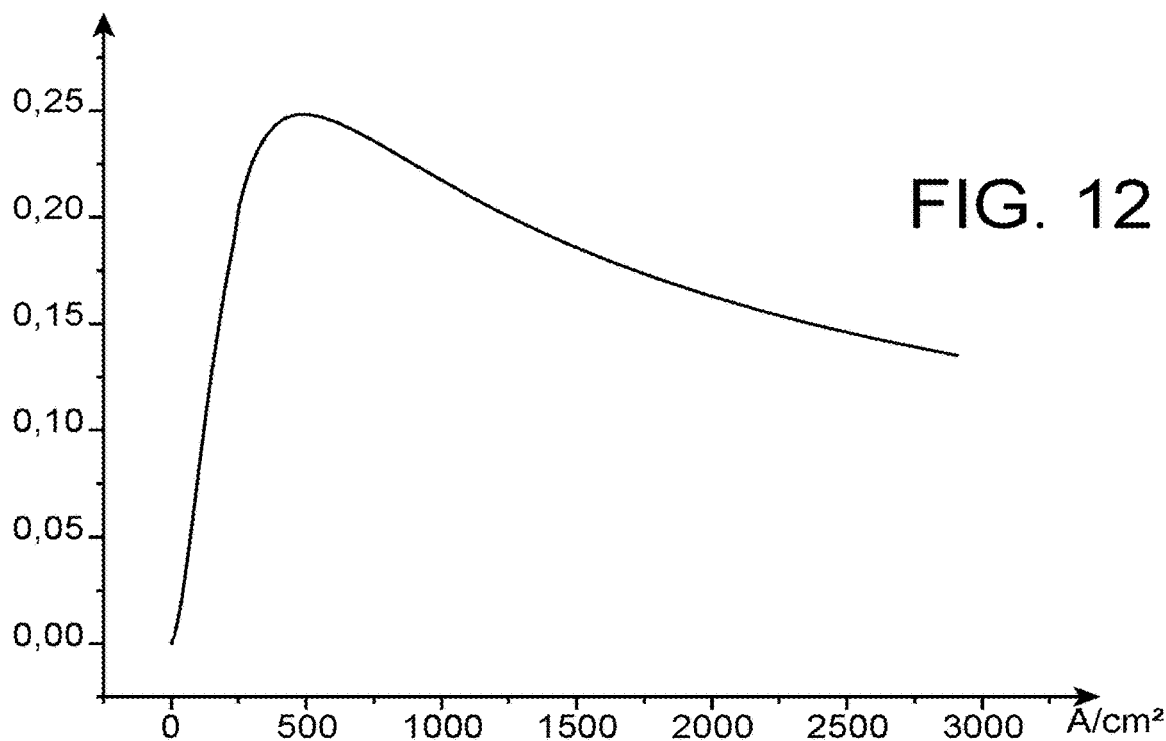
FIG. 12 shows the internal quantum efficiency of the light-emitting diode according to this invention shown in FIG. 7, as a function of the current density at the anode of the light-emitting diode.

The internal quantum efficiency of the diode 100 that corresponds to the ratio between the number of electrons injected and the number of photons emitted by the quantum wells of the diode 100 as a function of the current density (in A/cm') in the diode 100 is shown in FIG. 12. This figure shows that the maximum internal quantum efficiency of the diode 100 is about 25% and is obtained for a current density of about 500 A/cm², which is much higher than the maximum efficiency of 4% obtained with the diode 10 according to prior art (efficiency multiplied by a factor of about 6).

The diode 100 is preferably made respecting the parameters given below to assure that differences in radiative recombination ratios remain less than about 1 order of magnitude, in other words such that the lowest radiative recombination ratio in quantum wells of the diode 100 is not less than about one tenth of the highest radiative recombination ratio in the quantum wells of diode 100.

When the diode 100 comprises a number n of quantum wells and therefore n emissive layers 106 such that 2≤n≤5, and when the indium composition in the semiconductor of barrier layers 108 is approximately equal to or is less than the indium composition in the semiconductor of the buffer layer 110, then:
- The semiconductor of emissive layers 106 preferably contains between about 10% and 30% of indium;
- The indium composition x in the semiconductor of the barrier layers 108 is preferably greater than about 2.5%;
- The indium composition x in the semiconductor of the barrier layers 108 is preferably at least about 3% less than the indium composition y in the semiconductor of the emissive layers 106;
- The thickness of the buffer layer 110 is preferably more than about 5 nm.

Thus when 2≤n≤5, for an indium composition y equal to about 10% in the emissive layers 106, an indium composition x equal to about 2.5% in the barrier layers 108 (and therefore also in the buffer layer 110) is sufficient to homogenise the light emission in all quantum wells of diode 100. If the indium composition y is equal to about 22%, an indium composition x equal to at least about 8% can give good homogenisation of light emission in all quantum wells of the diode 100. Furthermore for a diode 100 comprising an active zone 105 containing five quantum wells, in other words five emissive layers 106 with an indium composition y equal to about 16% in the emissive layers 106, the barrier layers 108 and the buffer layer 110 may be made from a semiconductor with an indium composition x equal to about 8%, the buffer layer 110 in this case possibly being more than about 20 nm thick.

When the diode 100 comprises a number n of quantum wells such that 5≤n≤10, and when the indium composition in the semiconductor of the barrier layers 108 is less than or equal to the indium composition in the semiconductor of the buffer layer 110, then:

The semiconductor of the emissive layers 106 preferably comprises between about 10% and 30% of indium;

The semiconductor of the barrier layers 108 preferably comprises an indium composition x greater than about 4%;

The semiconductor of the barrier layers 108 preferably comprises an indium composition x at least about 3% less than the indium composition y in the semiconductor of the emissive layers 106;

The thickness of the buffer layer 110 is preferably more than about 5 nm.

Thus, when 5≤n≤10 for an indium composition y equal to about 10% in the emissive layers 106, an indium composition x equal to about 4% in the barrier layers 108 (and therefore also in the buffer layer 110) is sufficient to make the light emission homogeneous throughout all quantum wells of the diode 100. For an indium composition y equal to about 22%, an indium composition x equal to at least about 12% can give good homogenisation of light emission in all quantum wells of the diode 100. Furthermore, for a diode comprising an active zone 105 formed from ten quantum wells with an indium composition y equal to about 16% in the emissive layers 106, the barrier layers 108 and the buffer layer 110 can be made from a semiconductor with an indium composition x equal to about 10% or 12%, and in this case the buffer layer 110 may be more than about 20 nm thick.

When the diode 100 comprises a number n of quantum wells such that n 10 and when the indium composition in the semiconductor of the barrier layers 108 is less than or equal to the indium composition in the semiconductor of the buffer layer 110, then:

The semiconductor of the emissive layers 106 preferably comprises between about 10% and 30% of indium;

The indium composition x in the semiconductor of the barrier layers 108 is preferably greater than about 6%;

The semiconductor of the barrier layers 108 preferably comprises an indium composition x at least about 3% less than the indium composition y in the semiconductor of the emissive layers 106;

The thickness of the buffer layer 110 is preferably more than about 5 nm.

Thus, when n≥10 for an indium composition y equal to about 10% in the emissive layers 106, an indium composition x equal to about 6% in the barrier layers 108 (and therefore also in the buffer layer 110) is sufficient to make the light emission homogeneous in all quantum wells of the diode 100. For an indium composition y equal to about 22%, an indium composition x equal to at least about 13% can give good homogenisation of light emission in all quantum wells of the diode 100. Furthermore in this case the thickness of the buffer layer may be greater than about 20 nm.

The example embodiment of the diode 100 described above comprises a buffer layer 110 comprising a semiconductor (InGaN in the example described) with an indium composition approximately equal to the indium composition in the semiconductor of the barrier layers 108. As a variant, the indium composition in the semiconductor of the buffer layer 110 may be different from the indium composition in the semiconductor of the barrier layers 108, and particularly it may be more than that of the semiconductor of the barrier layers 108.

Furthermore, the diode 100 described above comprises a buffer layer 110 comprising a semiconductor with a constant indium composition throughout the entire buffer layer 110. As a variant, the indium composition denoted z in the semiconductor of the buffer layer 110 may vary between a first value $z_1$ and a second value $z_2$ more than the first value $z_1$ along a direction approximately perpendicular to a first face 116 of the buffer layer 110 in contact with which the first GaN-n layer 102 is located (in other words along the thickness of the buffer layer 110 parallel to the Z axis shown in FIG. 7), and in which the indium composition z at the first face 116 of the buffer layer 110 is equal to the first value $z_1$. In this case it is advantageous to have a buffer layer 110 in which the semiconductor comprises a variable indium composition so that the value of the indium composition in the semiconductor can be varied gradually from the first layer 102 (equal to zero in the examples described above) to the value of the indium composition in the semiconductor of the first barrier layer 108.1 in contact with the buffer layer 100 at a face 118 opposite the first face 116.

Figure 13:
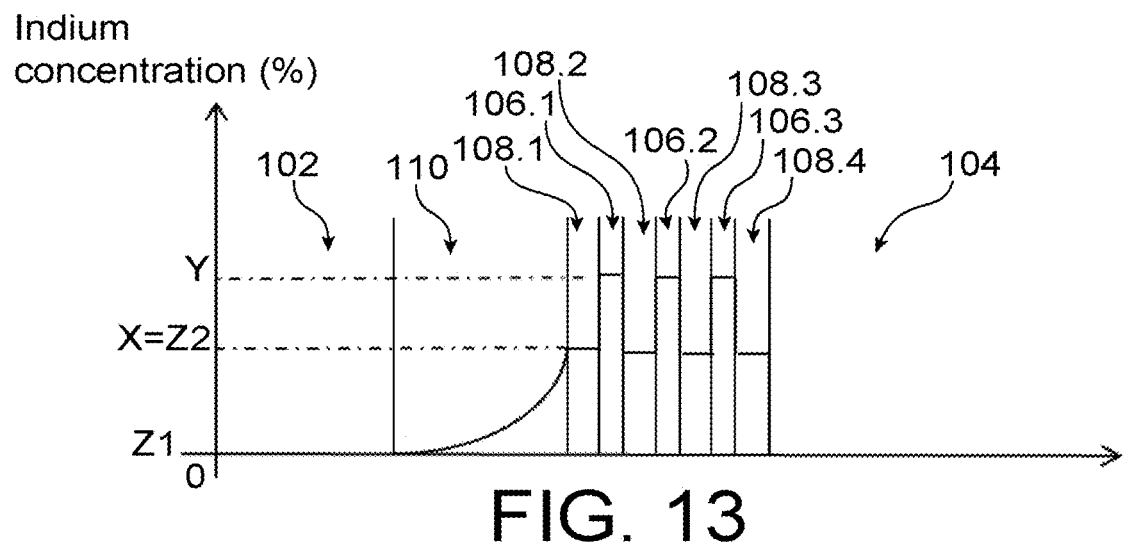
FIGS. 13 to 15 show examples of variation profiles of the indium composition in semiconductors in different layers of the diode according to this invention, FIGS. 16A and 16B diagrammatically show light-emitting diodes according to this invention made in the form of nano-wires.

FIG. 13 shows a first example of a variation profile of the indium composition in semiconductors of the different layers of the diode 100. The indium composition in the first GaN-n layer 102 is approximately zero. The indium composition in the buffer layer 110 varies increasingly (for example exponentially) between a first approximately zero value $z_1$ and a second value $z_2$=x or $z_2$≥x, where x corresponds to the indium composition in the semiconductor of the barrier layers 108. The indium composition in the semiconductor of the emissive layers 106 is denoted y and is more than the value of x. Finally, the indium composition is in the second GaN-p layer 104 approximately zero. Such a variation of the indium composition in the buffer layer 110 may be envisaged by making the buffer layer 110 and the first barrier layer 108.1 such that the sum of the thicknesses of these two layers is greater than or equal to about 5 nm. This variation profile of the indium composition in the buffer layer 110 has the advantage of progressively adapting the mesh parameter of the semiconductor in the first layer 102 to the mesh parameter of the semiconductor in the first barrier layer 108.1.

Figure 14:
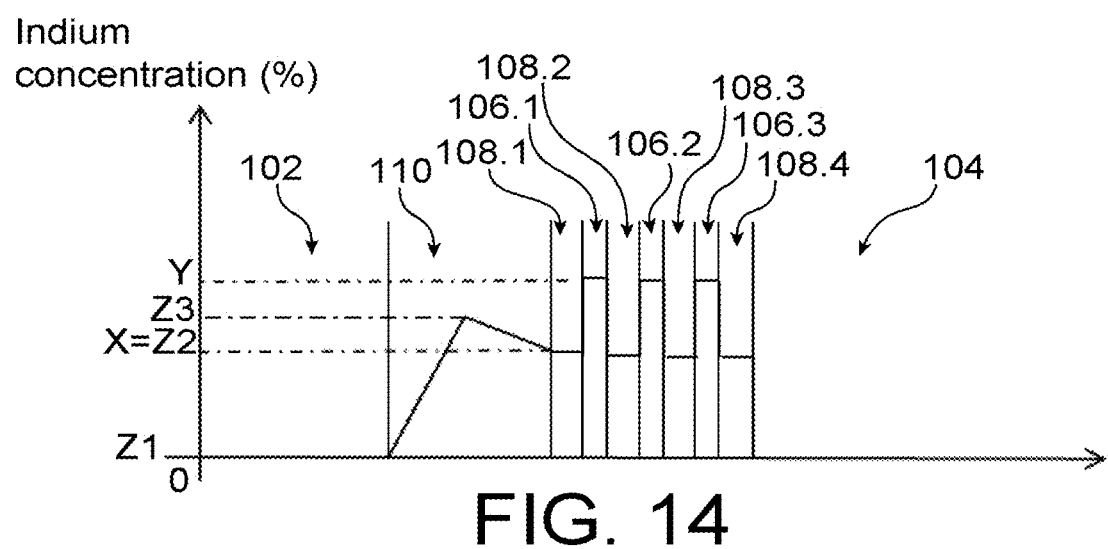

FIG. 14 shows a second example of the variation profile of the indium composition in the semiconductors of the different layers of the diode 100. Unlike the first example described above with reference to FIG. 13, the indium composition in the semiconductor of the buffer layer 110 increases firstly linearly from the first approximately zero value $z_1$ to a third value $z_3$ more than the value x, and then decreases linearly from the third value $z_3$ to the second value $z_2$=x or $z_2$ x. This variation profile in the indium composition in the buffer layer 110 has the advantage of further facilitating the passage of holes in the different quantum wells of the diode 100.

Figure 15:
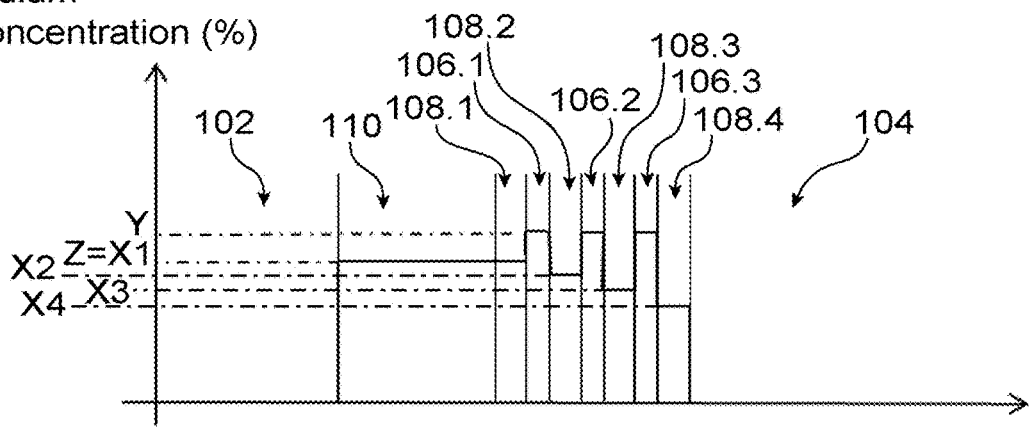

In another variant, it is also possible that each of the barrier layers 108 comprises a semiconductor with an indium composition different from the indium composition in the semiconductors of the other barrier layers 108. FIG. 15 shows an example of a profile of the variation of the indium composition in semiconductors in the different layers of such a diode. This figure shows that the indium composition $x_1$ in the semiconductor of the first barrier layer 108.1 is equal to the indium composition in the semiconductor of the buffer layer 110. As a variant, it is possible that the indium composition in the semiconductor in the buffer layer 110 is variable, for example as described previously with reference to FIGS. 13 and 14. The indium composition $x_2$ in the second barrier layer 108.2 is less than $x_1$. Similarly, the indium composition $x_3$ in the third barrier layer 108.3 is less than $x_2$, and the indium composition $x_4$ in the fourth barrier layer 108.4 is less than $x_3$. Obviously, it is quite possible that the diode 100 should have a different number of barrier layers depending on the number of quantum wells included in the diode 100. Such a variant may advantageously be used for a diode containing at least three quantum wells and preferably made respecting the following parameters.

When the diode 100 comprises a number n of quantum wells and therefore emissive layers 106 such that 3 n 5, then:
  The semiconductor of the emissive layers 106 preferably comprises between about 10% and 30% of indium;
  The semiconductor of the first barrier layer 108 (the layer in contact with the buffer layer 110) comprises an indium composition $x_1$ preferably greater than about 4%, and the semiconductor of the last barrier layer 108 (the layer in contact with the second GaN-p layer 104) comprises a composition $x_m$ (where m is the total number of barrier layers in the diode) of indium preferably equal to about 0.5%;
  The thickness of the buffer layer 110 is preferably more than about 5 nm.

Thus, for a diode 100 with an active zone 105 composed of five quantum wells, or five emissive layers 106, with an indium composition y equal to about 16% in the emissive layers 106, the first barrier layer 108.1 can be made from a semiconductor with an indium composition $x_1$ equal to about 6.5% or 7.5%. The indium composition of the other barrier layers can reduce by 1% for each of the subsequent barrier layers until the last barrier layer 108.6 is reached (the layer in contact with the second GaN-p layer 104) for which the indium composition $x_6$ is then equal to about 0.5% or about 1.5%.

When the diode 100 comprises a number n of quantum wells such that n 10 then:
  The semiconductor of the emissive layers 106 preferably comprises between about 10% and 30% of indium;
  The semiconductor of the first barrier layer 108 comprises an indium composition $x_1$ preferably more than about 8%, and the semiconductor of the last barrier layer 108 comprises an indium composition $x_m$ preferably equal to about 0.5%;
  The thickness of the buffer layer 110 is preferably more than about 5 nm.

When the diode 100 comprises a number n of quantum wells such that n 10, then:
  The semiconductor of the emissive layers 106 preferably comprises between about 10% and 30% of indium;
  The semiconductor of the first barrier layer 108 comprises an indium composition $x_1$ preferably greater than about 12%, and the semiconductor of the last barrier layer 108 comprises an indium composition $x_m$ preferably equal to about 2.5%;
  The thickness of the buffer layer 110 is preferably more than about 5 nm.

Thus, for a diode comprising an active zone 105 composed of ten quantum wells or ten emissive layers 106 with an indium composition y equal to about 16% in the emissive layers, the first barrier layer 108.1 may be made from a semiconductor with an indium composition $x_1$ equal to about 14%. The indium composition of the other barrier layers can reduce by 1% for each of the subsequent barrier layers until reaching the last barrier layer 108.11 for which the indium composition $x_{11}$ is equal to about 3%.

In one variant embodiment, it is possible that the p-doped semiconductor of the second layer 104 is composed partly of indium and for example is p-doped InGaN. In this case, the values of the indium compositions of the other elements of the diode 100 (buffer layer 110, barrier layers 108, emissive layers 106) may for example be based on previously described values, but in which the percentage of indium located in the semiconductor of the second layer 104 is added. Furthermore according to this variant, the indium composition in the semiconductor of the buffer layer 110 will preferably be similar to the indium composition in the semiconductor of the first barrier layer 108 in contact with the buffer layer 110, or it may be variable and in particular it may be higher as described previously with reference to FIGS. 13 and 14.

Finally, it is also possible that the first layer 102 of n-doped semiconductor and the buffer layer 110 of the diode 100 correspond to the same single layer of an n-doped semiconductor, for example InGaN-n. In this case the concentration of donor dopant in such a layer may be similar to the concentration described previously for the first GaN-n layer 102, and the indium composition of such a layer may be similar to that described previously for the buffer layer 110.

The thickness of such a layer may be between about 20 nm and 10 μm.

This single layer of n-doped semiconductor layer may be in contact with a silicon, sapphire, SiC or even intrinsic GaN substrate, or with an n-doped layer of silicon, SiC, etc.

In another variant, it is possible that the p-n junction of the diode 100 is formed by a first InGaN-n layer 102 and by a second InGaN-p layer 104. The materials of the buffer layer 110 and the second layer 104 are such that the n-doped semiconductor of the buffer layer 110 has a band gap energy less than or equal to about 97% of the band gap energy of the p-doped semiconductor of the second layer 104 ($Eg_{110} \leq 0.97\, Eg_{104}$), which results in an indium concentration in the n-doped semiconductor of the buffer layer 110 that is at least 2.5% higher than the indium concentration in the p-doped semiconductor of the second layer 104. In this case, the values of indium concentrations x and y in the semiconductors of the barrier layers 108 and emissive layers 106 in the different relations described above are increased by the value of the indium concentration in the p-doped semiconductor of the second layer 104.

In the different examples and variants described above, the semiconductor used for the different elements of the diode 100 is GaN (with the addition of indium to produce the emissive layers, the barrier layers and the buffer layer, and possibly also to make the first layer 102 and/or the second layer 104).

However, it is possible to make the diode 100 from any semiconductor from which p-n junctions suitable for light-emitting diodes with multiple quantum wells can be made and with large mobility differences for electrons and holes and/or large doping differences. Instead of GaN, it is also possible to use large gap semiconductors for example such as GaInN, ZnO, ZnMgO, or ZnMgO that can potentially be used to make light emission in the range of wavelengths corresponding to blue or ultra-violet. Smaller gap semiconductors can also be used, for example such as InP, GaP, InGaP, InAs, GaAs, InGaAs, AlGaInP, AlGaAs.

As a variant, the diode 100 may also comprise an electron blocking layer, for example comprising AlGaN, placed between the last barrier layer (corresponding to layer 108.4 in the examples described above) and the second p-doped semiconductor layer 104.

Such an electron blocking layer can even further prevent electrons passing to the second p-doped semiconductor layer 104.

This type of electron blocking layer can also reduce the DROOP, in other words the drop in the internal quantum efficiency when the current density in the diode increases, this drop being partially due to electrons escaping from the active zone when the current is increased. With reference to FIG. 12, the addition of this type of electron blocking layer can attenuate the reduction in the internal quantum efficiency of the diode when the current density is more than about 500 A/cm².

The light-emitting diode 100 according to the invention disclosed above, comprising an active zone composed of an alternation of quantum wells and barrier layers, and a buffer layer, can be made in the form of a planar diode, in other words in the form of a stack of layers (102, 110, 105 and 104) formed on a substrate as shown in FIG. 7, the main faces of the different layers being arranged parallel to the plane of the substrate (parallel to the (X,Y) plane).

Figure 16A:
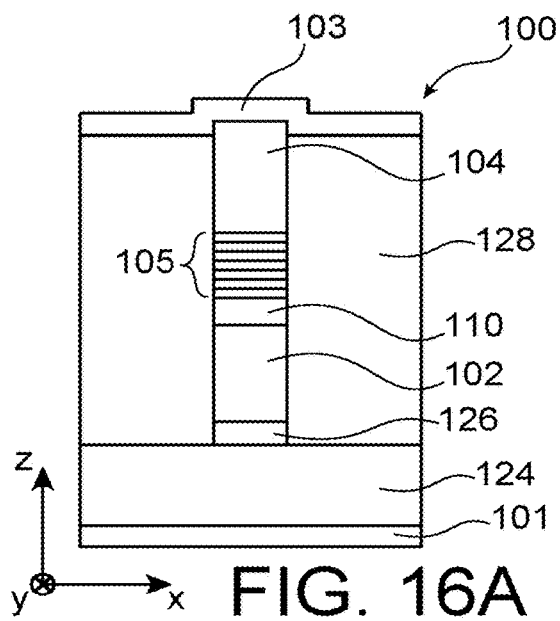

As a variant, the light-emitting diode 100 according to the invention may also be made in the form of a nano-wire. FIG. 16A shows such a diode 100 made in the form of an axial nano-wire, this nano-wire comprising a stack composed of the first electrode 101, an n type semiconductor substrate 124 (for example silicon), a nucleation layer 126 on which the nano-wire grows, the first n-doped semiconductor layer 102, the n-doped semiconductor buffer layer 110, the active zone 105, the second p-doped semiconductor layer 104, and the second electrode 103. An insulating material 128 may at least partly surround this nano-wire that extends parallel to the Z axis.

Figure 16B:
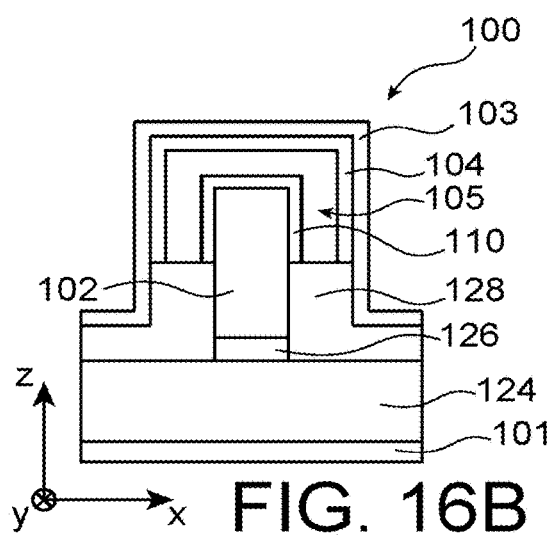

FIG. 16B shows a diode 100 made in the form of a radial nano-wire, this nano-wire comprising a stack formed from the first electrode 101, the semiconductor substrate 124, the nucleation layer 126 and the first n-doped semiconductor layer 102. Insulating portions 128 partly surround the first layer 102 and the nucleation layer 126. The buffer layer 110 is made such that it at least partially surrounds the first layer 102. The active zone 105 (formed from barrier layers 108 and emissive layers 106) is made such that it surrounds the buffer layer 110. The second p-doped semiconductor layer 104 is made such that it surrounds the active zone 105. Finally, the second electrode 103 is made by covering the second layer 104.

As a variant to the two example embodiments described in FIGS. 16A and 16B, the structure of these nano-wires may be inverted, in this case with a p type semiconductor substrate 124 on which the second layer 104 is made, and then the other elements of the diode 100 in the order inverse to the order described in FIGS. 16A and 16B.

The different characteristics (thicknesses, doping, etc.) described above for the planar type diode 100 may be similar for the diode 100 made in the form of a nano-wire.

The invention claimed is:

1. A light-emitting diode having a cathode electrode and an anode electrode, comprising:
    an n-doped semiconductor layer connected to the cathode electrode of the light-emitting diode;
    a p-doped semiconductor layer connected to the anode electrode of the light-emitting diode;
    an active zone located between the n-doped semiconductor layer and the p-doped semiconductor layer, including at least two semiconductor emissive layers being configured to form quantum wells, and a plurality of semiconductor barrier layers such that each of the at least two semiconductor emissive layers is disposed between two barrier layers that are in contact with said each of the at least two semiconductor emissive layers at two opposite faces of said each of the at least two semiconductor emissive layers; and
    an n-doped semiconductor buffer layer disposed between the n-doped semiconductor layer and the active zone, a band gap energy of the n-doped semiconductor in the n-doped semiconductor buffer layer at an interface with the active zone being less than or equal to about 97% of a band gap energy of a p-doped semiconductor in the p-doped semiconductor layer,
    wherein when the light-emitting diode comprises m semiconductor barrier layers, m being a positive integer, the semiconductor in each of said m semiconductor barrier layers is $In_{xi}Ga_{1-xi}N$, where i is an integer number from 1 to m, the semiconductor of the n-doped semiconductor buffer layer is $In_zGa_{1-z}N$, where z varies in the n-doped semiconductor buffer layer so as to increase in a direction from the cathode electrode to the anode electrode, and the semiconductor of the at least two semiconductor emissive layers is $In_yGa_{1-y}N$, where $x_i$, y, and z are real numbers such that $0.025 \leq z$ at an interface of the n-doped semiconductor buffer layer and the active zone, $0.1 \leq y$, $x_i < y$, and $z < y$, and
    wherein a composition $x_i$ of indium is different for each of the semiconductor barrier layers, the indium compositions for said each of the semiconductor barrier layers gradually varying and decreasing from a first value $x_1$, corresponding to an indium composition in the semiconductor of one of the semiconductor barrier layers in contact with the n-doped semiconductor buffer layer, such that $x_1 \leq z$, to another value $x_m$, corresponding to an indium composition in the semiconductor of one of the semiconductor barrier layers in contact with the p-doped semiconductor layer, such that $x_m < x_1$, and where $m \geq 3$.

2. The light-emitting diode according to claim 1, wherein the n-doped semiconductor of the n-doped semiconductor layer and/or the p-doped semiconductor of the p-doped semiconductor layer is GaN, and/or the semiconductors of the at least two semiconductor emissive layers and/or the plurality of semiconductor barrier layers and/or the n-doped semiconductor buffer layer is InGaN.

3. The light-emitting diode according to claim 1, wherein an indium composition in the n-doped semiconductor of the n-doped semiconductor buffer layer at the interface of the n-doped semiconductor buffer layer and the active zone is at least 2.5% more than an indium composition in the p-doped semiconductor of the p-doped semiconductor layer.

4. The light-emitting diode according to claim 1, wherein the doping concentration is the same for the n-doped semiconductor buffer layer and the n-doped semiconductor layer.

5. The light-emitting diode according to claim 1, wherein the n-doped semiconductor buffer layer is more than about 5 nm thick.

6. The light-emitting diode according to claim 1, wherein the light-emitting diode contains a number n of semiconductor emissive layers such that $2 \leq n \leq 5$, and the semiconductors of the plurality of semiconductor barrier layers and the at least two semiconductor emissive layers are such that $(x_i + 0.03) \leq y$ or such that $x_1 > 0.04$ and $x_m \geq 0.005$, and $(x_1 + 0.03) \leq y$.

7. The light-emitting diode according to claim 1, wherein the light-emitting diode comprises a number n of semiconductor emissive layers such that 5≤n≤10, and the semiconductors of the plurality of semiconductor barrier layers and the at least two semiconductor emissive layers are such that $x_i$≥0.04 and $(x_i+0.03)$≤y or such that $x_i$>0.08 and $x_m$≥0.005 and $(x_1+0.03)$≤y, and/or a thickness of the n-doped semiconductor buffer layer is more than about 20 nm.

8. The light-emitting diode according to claim 1, wherein the light-emitting diode comprises a number n of semiconductor emissive layers such that n≥10, and the semiconductors of the plurality of semiconductor barrier layers and the at least two semiconductor emissive layers are such that $x_i$≥0.06 and $(x_i+0.03)$≤y or such that $x_i$>0.12 and $x_m$≥0.025 and $(x_1+0.03)$≤y, and/or the thickness of the n-doped semiconductor buffer layer is more than about 20 nm.

9. The light-emitting diode according to claim 1, wherein the indium composition z in the semiconductor of the n-doped semiconductor buffer layer at the interface of the n-doped semiconductor buffer layer and the active zone is approximately equal to or greater than the indium composition $x_i$ in the semiconductor of the plurality of semiconductor barrier layers.

10. The light-emitting diode according to claim 1, wherein the p-doped semiconductor of the p-doped semiconductor layer is $In_wGa_{1-w}N$, where w is a real number such that w<0.12 and the indium compositions w, $x_i$, y, and z are such that $(0.025+w)$≤$x_i$, $(0.025+w)$≤z at an interface of the p-doped semiconductor buffer layer and the active zone, and $(0.1+w)$≤y.

11. The light-emitting diode according to claim 1, wherein a band gap of the n-doped semiconductor buffer layer at the interface of the n-doped semiconductor buffer layer and the active zone is at least 2% larger than band gaps of the semiconductor emissive layers.

12. The light-emitting diode according to claim 1, wherein the n-doped semiconductor layer is GaN and the n-doped semiconductor buffer layer is InGaN.

13. A light-emitting diode having a cathode electrode and an anode electrode, comprising:
an n-doped semiconductor layer connected to the cathode electrode of the light-emitting diode;
a p-doped semiconductor layer connected to the anode electrode of the light-emitting diode;
an active zone located between the n-doped semiconductor layer and the p-doped semiconductor layer, including at least two semiconductor emissive layers being configured to form quantum wells, and a plurality of semiconductor barrier layers such that each of the at least two semiconductor emissive layers is disposed between two barrier layers that are in contact with said each of the at least two semiconductor emissive layers at two opposite faces of said each of the at least two semiconductor emissive layers; and
an n-doped semiconductor buffer layer disposed between the n-doped semiconductor layer and the active zone, a band gap energy of the n-doped semiconductor in the n-doped semiconductor buffer layer at an interface of the n-doped semiconductor layer and the active zone being less than or equal to about 97% of a band gap energy of a p-doped semiconductor in the p-doped semiconductor layer,
wherein when the light-emitting diode comprises m semiconductor barrier layers, m being a positive integer, the semiconductor in each of said m semiconductor barrier layers is $In_{xi}Ga_{1-xi}N$, where i is an integer number from 1 to m, the semiconductor of the n-doped semiconductor buffer layer is $In_zGa_{1-z}N$, and the semiconductor of the at least two semiconductor emissive layers is $In_yGa_{1-y}N$, where $x_i$, y, and z are real numbers such that 0.025≤z at a first interface of the n-doped semiconductor buffer layer and one of the semiconductor barrier layers, 0.1≤y, $x_i$<y, and z<y,
wherein a composition $x_i$ of indium is different for each of the semiconductor barrier layers, the indium compositions for said each of the semiconductor barrier layers gradually varying and decreasing from a first value $x_1$, corresponding to an indium composition in the semiconductor of the one of the semiconductor barrier layers in contact with the n-doped semiconductor buffer layer, such that $x_1$≤z, to another value $x_m$, corresponding to an indium composition in the semiconductor of another one of the semiconductor barrier layers in contact with the p-doped semiconductor layer, such that $x_m$<$x_1$, and where m≥3, and
wherein an indium concentration in the n-doped semiconductor buffer layer increases from a value $z_1$ equal to an indium concentration at a second interface of the n-doped semiconductor layer and the n-doped semiconductor buffer layer to a value $z_2$ equal to $x_1$ at the first interface.

14. The light-emitting diode according to claim 13, wherein $z_1$ is approximately 0.

15. The light-emitting diode according to claim 13, wherein an indium concentration in the n-doped semiconductor buffer layer increases to a value $z_3$ greater than each of $z_1$ and $z_2$ at a point between the first and second interfaces.

* * * * *